United States Patent [19]

Shonowaki et al.

[11] Patent Number: 5,325,056

[45] Date of Patent: Jun. 28, 1994

[54] MAGNETIC ENCODER WITH A PLURALITY OF MAGNETIC SIGNAL-GENERATING MEANS HAVING DIFFERENT MAGNETIC POLE PITCHES

[75] Inventors: Yukimasa Shonowaki, Kumagaya; Takehiko Sagara, Fukaya; Katsutoshi Hiratsu, Kumagaya; Michiyuki Fukushima, Kodama, all of Japan

[73] Assignee: Hitachi Metals, Ltd., Tokyo, Japan

[21] Appl. No.: 752,023

[22] Filed: Aug. 29, 1991

[30] Foreign Application Priority Data

Aug. 30, 1990 [JP] Japan .................................. 2-226724

[51] Int. Cl.$^5$ ...................... G01R 33/06; H01L 43/08; G01B 7/14
[52] U.S. Cl. ........................... 324/207.21; 324/207.24; 338/32 R
[58] Field of Search ...................... 324/207.21, 207.24, 324/252; 338/32 R

[56] References Cited

U.S. PATENT DOCUMENTS 4,599,561  7/1986  Takahashi et al. .............. 324/207.21

Primary Examiner—Walter E. Snow

[57] ABSTRACT

A magnetic encoder containing a magnetic drum having on its side surface a plurality of magnetic signal-generating means having different magnetic pole pitches, and a plurality of magnetoresistance elements each disposed opposite to each of the magnetic signal-generating means. The magneto resistance elements include a plurality of series-connected thin, ferromagnetic layer patterns having a magnetoresistance effect so that an output signal of each magnetoresistance element is in the form of a substantially sinusoidal curve. The magnetic pole pitch of one magnetic signal-generating means is 5 times or more the magnetic pole pitch of other magnetic signal-generating means, and the magnetoresistance element opposite to the magnetic signal-generating means having a larger magnetic pole pitch includes by 5 or more series-connected thin, ferromagnetic layer patterns within the range of one-fourth the larger magnetic pole pitch.

5 Claims, 6 Drawing Sheets

12 Patterns Each
8μm Wide

6 Patterns Each
8μm Wide

3 Patterns Each
8μm Wide

B Signal

Lissajous Figure

A Signal

FIG.11 PRIOR ART
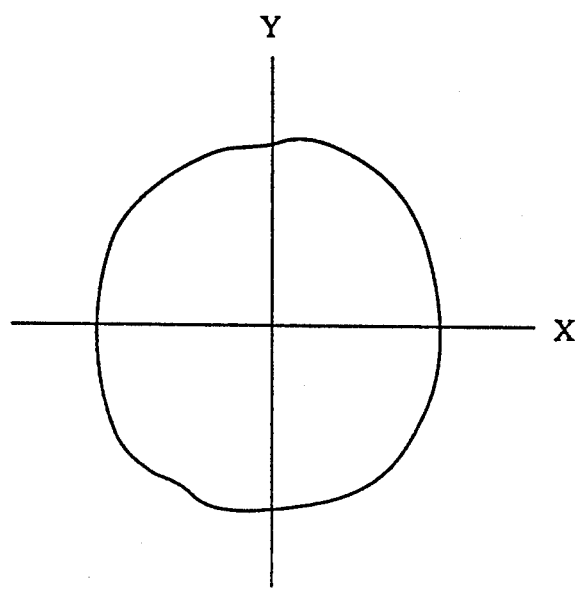
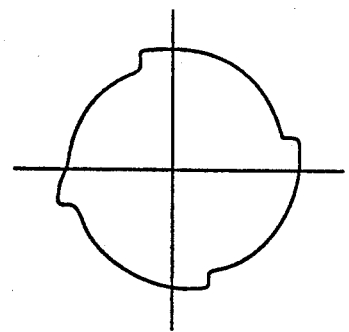
FIG.12A
$\dfrac{W}{\lambda} = \dfrac{1}{30}$
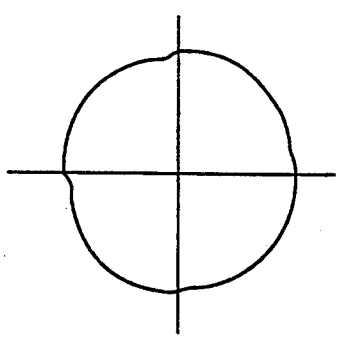
FIG.12B
$\dfrac{W}{\lambda} = \dfrac{1}{50}$
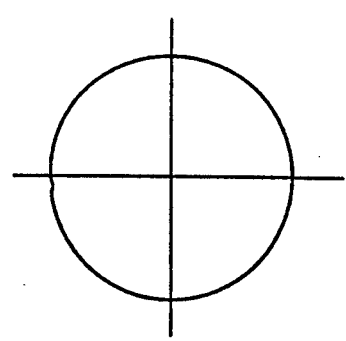
FIG.12C
$\dfrac{W}{\lambda} = \dfrac{1}{100}$

MAGNETIC ENCODER WITH A PLURALITY OF MAGNETIC SIGNAL-GENERATING MEANS HAVING DIFFERENT MAGNETIC POLE PITCHES

BACKGROUND OF THE INVENTION

1. Field of the Invention

The present invention relates to a magnetic encoder utilizing elements whose electric resistances vary depending upon magnetic fields according to a so-called magnetoresistance effect to convert the change of a magnetic field to an electric signal, thereby carrying out position detection, etc., and more particularly to a magnetic encoder having increased accuracy without noises in detection signals.

2. Description of the Related Art

In a wide variety of fields, such as NC machines, robots, OA equipment, VTRs, etc., position sensors or rotary sensors having a high degree of accuracy are needed. These sensors are used in various servomotors, rotary encoders, etc. in the above-noted industrial fields. Also, as the technologies of OA equipment and factory automation develop, there is an increasingly higher demand for speed and reliability in these sensors. Under such circumstances, optical-type sensors, for instance have been widely used as rotary sensors. However, they have semiconductor elements such as photocells, LEDs, etc. as constituent elements, and they are extremely sensitive to dust, and temperature variations. In addition, the optical-type sensors inevitably have a large number of constituent parts, leading to complicated structures.

Thus, magnetic-type sensors utilizing the magnetoresistance effect have recently been developed. These magnetic-type sensors show high detection accuracy and are stable to temperature variations and less sensitive to dust, so that wide ranging applications for these sensors have been developing in many fields.

FIG. 6 is a perspective view schematically showing one example of a conventional magnetic-type rotary sensor. In this figure, a magnetic drum 61 is fixed to a shaft 62 which rotates, for instance, counterclockwise in the direction shown by the arrow. The magnetic drum 61 is provided, on its side surface, with a magnetic signal-generating means 65 which has N magnetic poles arranged and S magnetic poles alternately. This magnetic signal-generating means 65 is made of a magnetic coating of $\gamma$-iron, etc. or a plastic magnet of strontium ferrite or barium ferrite, etc. The number of magnetic poles in the magnetic signal-generating means 65 may be properly determined within the range of two or more, depending upon the required detection precision. Accordingly, in a case where the number of magnetic poles is as many as several hundreds to several thousands, the magnetic pole pitch of the magnetic signal-generating means 65 is inevitably extremely small.

A magnetic sensor 63 is provided with a magnetoresistance element 64 including a plurality of thin, ferromagnetic layer patterns 66 having a magnetoresistance effect formed on a glass substrate 67. The magnetic sensor 63 is disposed opposite to the magnetic signal-generating means 65 of the magnetic drum 61, with such a small gap G therebetween that a magnetic field of each magnetic pole can sufficiently reach the magnetic sensor 63.

According to the above structure, when the magnetic drum 61 is rotated, the magnetoresistance element 64 disposed opposite to the magnetic drum 61 is subjected to a periodically changing magnetic field leaked from the surface of the magnetic signal-generating means 65. Thus, each thin, ferromagnetic layer pattern (magnetic field-detecting pattern) 66 in the magnetoresistance element 64 converts the intensity of the leaked magnetic field to a change in a resistivity, thereby generating an electric signal. As a result, a rotation speed or a position can be detected.

As described above, the conventional magnetic encoder shown in FIG. 6 includes the magnetic sensor 63 and the magnetic drum 61 provided with a magnetic signal-generating means 65, having a predetermined gap G therebetween. The magnetoresistance element 64 of the magnetic sensor 63 includes a plurality of electrically combined magnetic field-detecting patterns. With the magnetic encoder having the above-described structure, the detection of rotation speeds of motors and the positions of movable members in robots, NC machines, etc. can be carried out at a high precision.

However, increasingly wider varieties of functions and higher precision are recently required for the above machines, and detection equipment is required to be smaller and more accurate. For instance, magnetic encoders capable of carrying out detection at both a high rotation speed and a lower rotation speed with high precision are required. To meet these requirements, it is necessary to generate an electric signal or an output signal having different pulse numbers. However, since most of the conventional magnetic encoders are provided with a series of magnetic poles on side surfaces of rotational drums, they fail to meet the above requirements. Also, if a plurality of magnetic encoders are combined to meet the above requirements, a large number of parts are required, and the overall structure of the apparatus would become complicated, failing to meet the demand of miniaturization.

To solve these problems, investigation has been made to provide a structure shown in FIG. 7. This magnetic encoder comprises a magnetic drum 71 provided on its side surface with a Z phase element for generating a reference signal, and increment phase elements $I_1$, $I_2$, $I_3$ having a plurality of magnetic poles at different magnetic pole pitches, and a magnetic sensor 72 provided with independent magnetoresistance elements 72a, 72b, 72c disposed opposite to these increment phase elements $I_1$, $I_2$, $I_3$.

With such a structure, output signals having different pulse numbers can be generated. If an output signal having a lower pulse number is used for detection at a higher rotation speed, and an output signal having a higher pulse number is used for detection at a lower rotation speed, high-precision detection can be achieved at both higher and lower rotation speeds. Also, by simultaneously detecting the low-pulse number signal and the high-pulse number signal, a signal pulse of high precision can be synthesized in a subsequent circuit.

However, in a case where the increment phase elements $I_1$, $I_2$, $I_3$ having different magnetic poles are disposed on the same magnetic drum, the following problems arise. That is, for instance, in a case where the increment phase elements $I_1$, $I_2$, satisfy the relation $l_1/l_2 > 1$, wherein $l_1$ and $l_2$ represent the magnetic pole pitches of the increment phase elements $I_1$, $I_2$, a gap G between each of the increment phase elements $I_1$, $I_2$, and each of the corresponding magnetoresistance elements 72a, 72b results in the relation shown in FIG. 8 between the output of each magnetoresistance element 72a, 72b and the size of the gap G.

When there is a large magnetic pole pitch, the magnetic signal supplied from the magnetic drum 71 is strong in a wide range of gap, with a small variation of an output relative to the variation of the gap. On the other hand, when the magnetic pole pitch is small, the magnetic signal is weak, and its strong region is narrow on the side of the smaller gap, the output drastically changing relative to the gap variation. Accordingly, the gap between the magnetic drum 71 and the magnetic sensor 72 should be such that it is suitable for the magnetic signal-generating means having a smaller magnetic pole pitch. One example of such a small gap is shown as "G" in FIG. 8.

The inventors have been investigating a magnetic drum having different-diameter areas, a magnetoresistance element having a larger magnetic pole pitch provided on a larger diameter area of the magnetic drum, and a magnetoresistance element having a smaller magnetic pole pitch provided on a smaller diameter area of the magnetic drum, thereby providing two signals on the same drum surface.

However, the signal generated by the magnetoresistance element corresponding to the magnetic signal-generating means having a larger magnetic pole pitch is a deformed waveform containing noises as shown in FIG. 9. This seems to be due to the fact that since the gap between the magnetic drum and the magnetic sensor is determined such that it is proper for the magnetoresistance element opposite to the magnetic signal-generating means having a smaller magnetic pole pitch (smaller gap), the gap is not necessarily suitable for the magnetoresistance element opposite to the magnetic signal-generating means having a larger magnetic pole pitch. Further, while the magnetic field-detecting patterns of the magnetic sensor can occupy a considerable width in the case of the smaller magnetic pole pitch, the percentage of the pattern width in the magnetic field is small in the case of the larger magnetic pole pitch, whereby the magnetic sensor is more sensitive to the fluctuation of the magnetic field.

In general, increment signals (INS) having a phase difference of 90° are evaluated with respect to their precision of waveforms by forming a Lissajous figure. As is shown in FIG. 10A, when signals A and B having a phase difference of 90° are plotted as an X coordinate and a Y coordinate, a circular Lissajous figure as shown in FIG. 10B can be obtained. When the signals A, B are completely sine and cosine curves, the resulting Lissajous figure is completely circular. However, in the conventional magnetic encoder, deformed waveforms are generated, resulting in a deformed circle as shown in FIG. 11.

OBJECT AND SUMMARY OF THE INVENTION

Accordingly, an object of the present invention is to provide a magnetic encoder capable of generating a plurality of detection signals free from noises, thereby achieving high-precision detection.

Thus, the magnetic encoder according to one embodiment of the present invention comprises a magnetic drum having on its side surface a plurality of magnetic signal-generating means having different magnetic pole pitches, and a plurality of magnetoresistance elements each disposed opposite to each of the magnetic signal-generating means. The magnetoresistance elements include a plurality of series-connected thin, ferromagnetic layer patterns having a magnetoresistance effect so that an output signal of each magnetoresistance element is in the form of a substantially sinusoidal curve. Further, the magnetic pole pitch of one magnetic signal-generating means is 5 times or more the magnetic pole pitch of other magnetic signal-generating means, and the magnetoresistance element opposite to the magnetic signal-generating means having a larger magnetic pole pitch includes 5 or more series-connected thin, ferromagnetic layer patterns within the range of one-fourth the larger magnetic pole pitch.

The magnetic encoder according to another embodiment of the present invention comprises a magnetic drum having on its side surface a plurality of magnetic signal-generating means having different magnetic pole pitches, and a plurality of magnetoresistance elements each disposed opposite to each of the magnetic signal-generating means. The magnetoresistance elements include a plurality of series-connected thin, ferromagnetic layer patterns having a magnetoresistance effect so that an output signal of each magnetoresistance element is in the form of a substantially sinusoidal curve. Further, the thin, ferromagnetic layer patterns constituting the magnetoresistance element disposed opposite to the magnetic signal-generating means having a larger magnetic pole pitch, have a width of 1/50 or less of the larger magnetic pole pitch.

BRIEF DESCRIPTION OF THE DRAWINGS

FIG. 11 is a view showing a Lissajous figure obtained in the case of the conventional magnetic encoder, and FIGS. 12A–12C are views showing Lissajous figures at various ratios of a pattern width to a magnetic pole pitch.

DETAILED DESCRIPTION OF THE PREFERRED EMBODIMENTS

The magnetic pole pitch of one magnetic signal-generating means is five times or more as large as that of another magnetic signal-generating means, and in this case, the magnetoresistance element opposite to the magnetic signal-generating means having the larger magnetic pole pitch should be constituted by five or more series-connected thin, ferromagnetic layer patterns within the range of one-fourth the larger magnetic pole pitch. Since the deformation of the waveform tends to become larger as the magnetic pole pitch increases, the number of thin, ferromagnetic layer patterns should be larger than a certain level in the case of the larger magnetic pole pitch. The preferred number of thin, ferromagnetic layer patterns is 9 or more, particularly 9–20.

The thin, ferromagnetic layer patterns constituting each magnetoresistance element are preferably in a rectangular form having a length/width ratio of 50 or more, particularly 50–600.

The thin, ferromagnetic layer patterns disposed opposite to the magnetic signal-generating means having a larger magnetic pole pitch preferably have a width of 5–15 $\mu$m to suppress Bark Hausen noises. The larger the magnetic pole pitch, the smaller the percentage of the sensor patterns in one magnetic pole pitch, resulting in larger noises in the waveform. Thus, the present invention is particularly effective when the larger magnetic pole pitch is about 1000 $\mu$m or more, particularly 1000–2000 $\mu$m. On the other hand, the smaller magnetic pole pitch is about 500 $\mu$m or less, particularly 50–200 $\mu$m.

Apart from the above, even by setting the width of thin, ferromagnetic layer patterns disposed opposite to the magnetic signal-generating means having a larger magnetic pole pitch less than or equal to 1/50 of the larger magnetic pole pitch, the noises of the detection waveform can be reduced. The preferred percentage of the width of each thin, ferromagnetic layer pattern to the larger magnetic pole pitch is 1/100–1/200.

In the above-described magnetic encoder, since the difference in a magnetic pole pitch between a plurality of magnetic signal-generating means is five times or more, and since the gap between the magnetic drum and the magnetic sensor is adjusted such that it is proper to the magnetic signal-generating means having a smaller magnetic pole pitch, the output characteristic of the magnetoresistance element opposite to the magnetic signal-generating means having a larger magnetic pole pitch is so deteriorated that it tends to generate a detection signal whose waveform contains noises.

However, since the magnetoresistance element is constituted by five or more thin, ferromagnetic layer patterns, the detection waveform obtained by synthesizing the outputs of the five or more thin, ferromagnetic layer patterns is substantially free from noises, leading to higher detection precision.

Specific examples of the present invention will further be explained referring to FIGS. 1–5.

Figure 1:
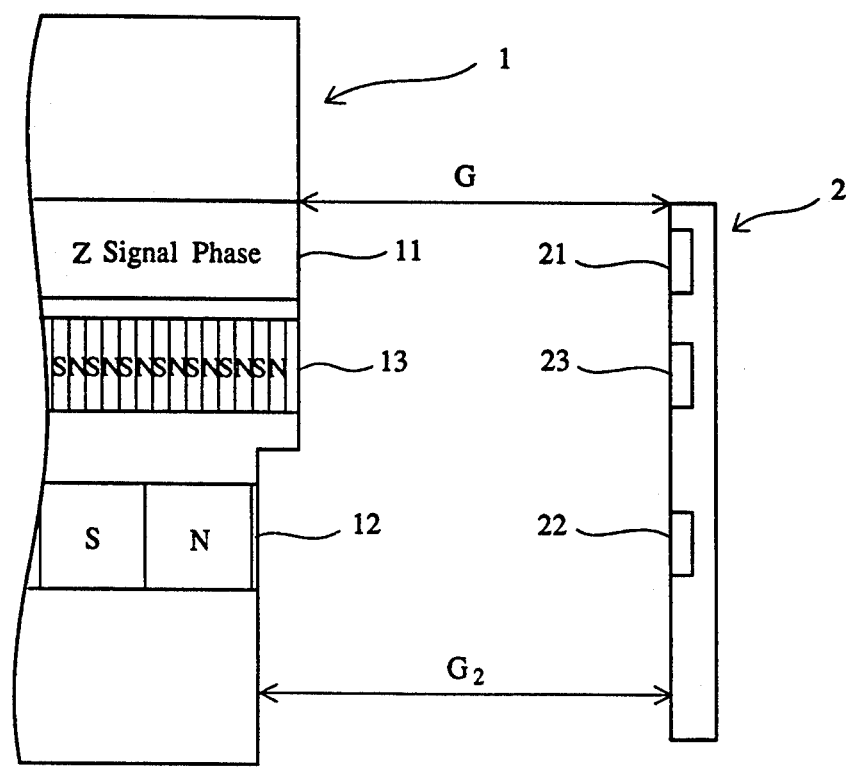
FIG. 1 is a partial schematic side view showing the magnetic encoder according to a first embodiment of the present invention.

As schematically shown in FIG. 1, the magnetic encoder in this example comprises a rotatable, cylindrical magnetic drum 1 and a magnetic sensor 2 disposed opposite to the magnetic drum 1 at a certain gap G, which generates a detection signal in the form of a sine curve.

The magnetic drum 1 is made of a non-magnetic material, and its side surface is provided with a magnetic coating layer containing magnetic powder such as Co-$\gamma$Fe$_2$O$_3$. This magnetic coating layer serves as a magnetic signal-generating means constituted by a Z phase element 11 for generating a one-pulse reference signal, an increment phase element (for I$_2$ signal) 12 having a magnetic pole pitch of 1600 $\mu$m for a detection at a higher rotational speed, and an increment phase element (for I$_1$ signal) 13 having a magnetic pole pitch of 200 $\mu$m for detection at a lower rotational speed. In both increment phase elements 12, 13, the pulse number (P/R) per one rotation is the same as the number of magnetic poles. Incidentally, the magnetic pole pitch of the increment phase element 12 is five times or more that of the increment phase element 13.

Figure 2:
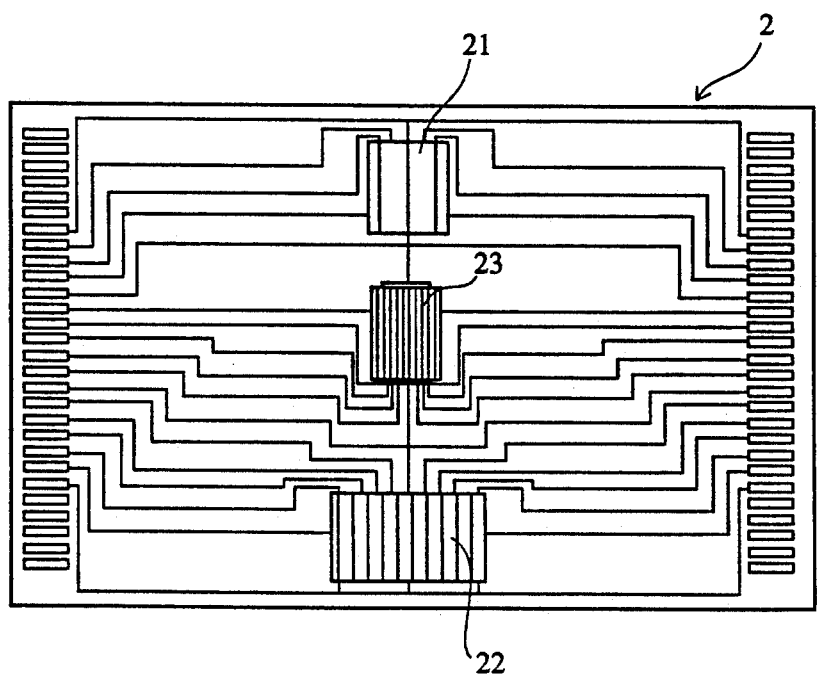
FIG. 2 is a front view showing a magnetic sensor.

The magnetic sensor 2 is provided with magnetoresistance elements 21, 22, 23 disposed opposite to the Z phase elements 11 and the increment phase elements 12, 13, respectively, on the magnetic drum 1, and the constitution of the magnetic sensor 2 is as shown in FIG. 2. Incidentally, in this example, the gap G between each magnetoresistance element 21, 23 and the Z phase element 11 and the increment phase element 13 is about 200 $\mu$m, and the gap G$_2$ between the magnetoresistance element 22 and the increment phase element 12 is about 700 $\mu$m.

Figure 3:
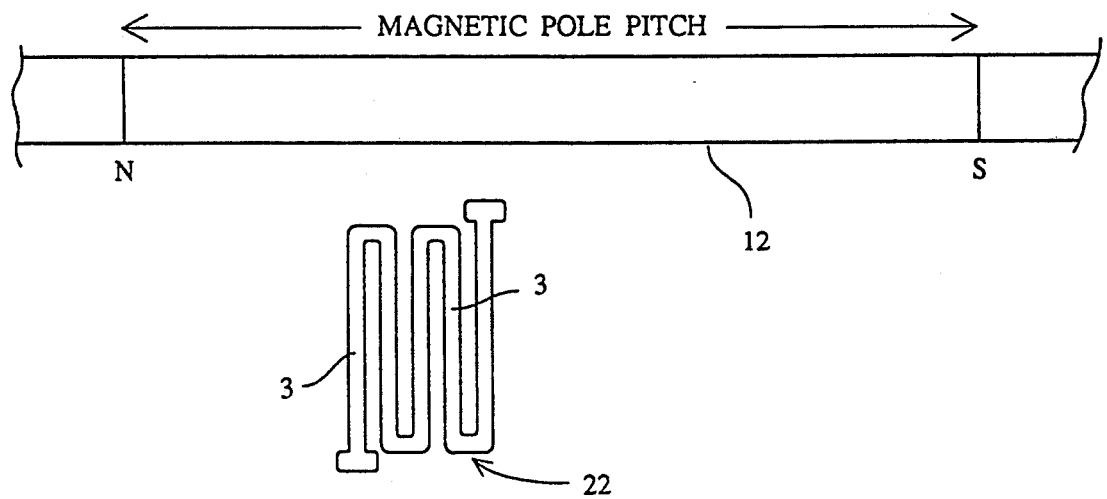
FIG. 3 is a schematic view showing a magnetic signal-generating means disposed on the side surface of a magnetic drum, and a magnetoresistance element constituting a part of the magnetic sensor.
Figure 4:
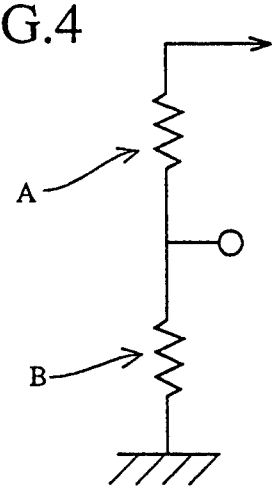
FIG. 4 is a view showing an equivalent circuit of the magnetic sensor.

The magnetoresistance element 22 disposed opposite to the increment phase element 12 having a larger magnetic pole pitch is constituted by five or more series-connected thin, ferromagnetic layer patterns 3 in a rectangular shape having a length/width ratio of 50 or more as shown in FIG. 3. In this example, within the length of ¼ of the magnetic pole pitch (1600 $\mu$m), two types of thin, ferromagnetic layer patterns; one constituted by 12 patterns (width=8 $\mu$m), and another constituted by 6 patterns (width=8 $\mu$m), and further a magnetoresistance element constituted by 3 thin, ferromagnetic layer patterns having a width of 8 $\mu$m were formed for testing. Incidentally, the magnetoresistance element 23 disposed opposite to the increment phase element 13 having a smaller magnetic pole pitch was constituted by a single thin, ferromagnetic layer pattern 3, but it may be constituted by a plurality of thin, ferromagnetic layer patterns connected in series.

By using magnetic sensors having three types of the magnetoresistance elements 22, the change of a magnetic signal of the magnetic drum was detected, and Lissajous figures were obtained by synthesizing detection signals from the A phase part and the B phase part of the equivalent circuit (FIG. 4) of the magnetoresistance element. These Lissajous figures are shown in FIGS. 5A, 5B and 5C.

Figure 5A:
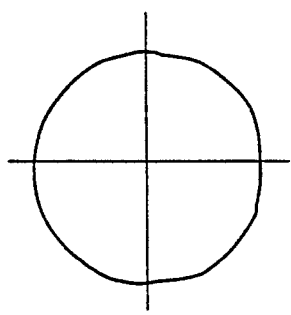
FIGS. 5A–5C are views each showing a Lissajous figure obtained by synthesizing detection signals obtained from an A-phase part and a B-phase part.
Figure 5B:
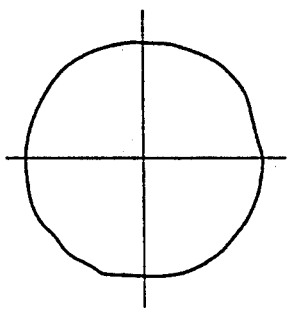
Figure 5C:
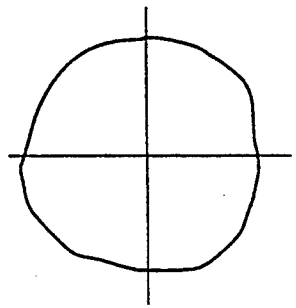
Figure 6:
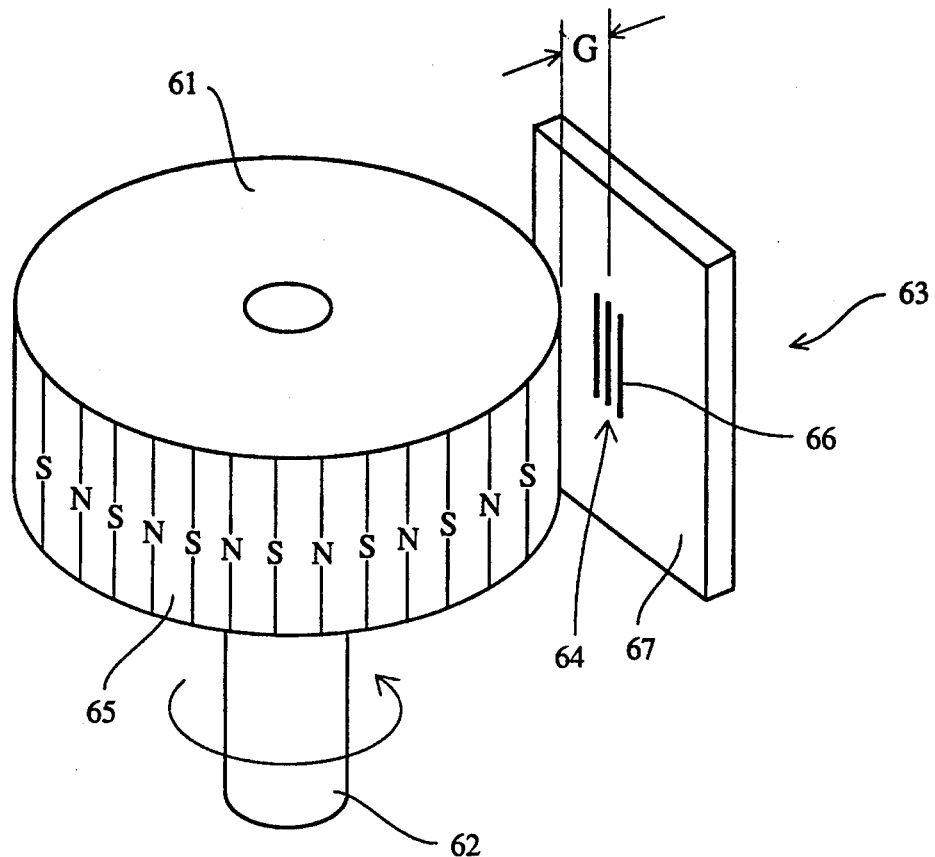
FIG. 6 is a perspective view showing a conventional magnetic encoder.
Figure 7:
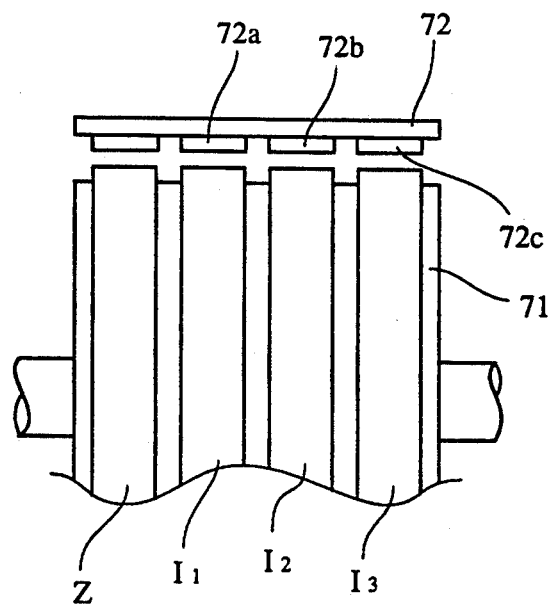
FIG. 7 is a partial side view showing a magnetic encoder provided with a plurality of increment phase elements.
Figure 8:
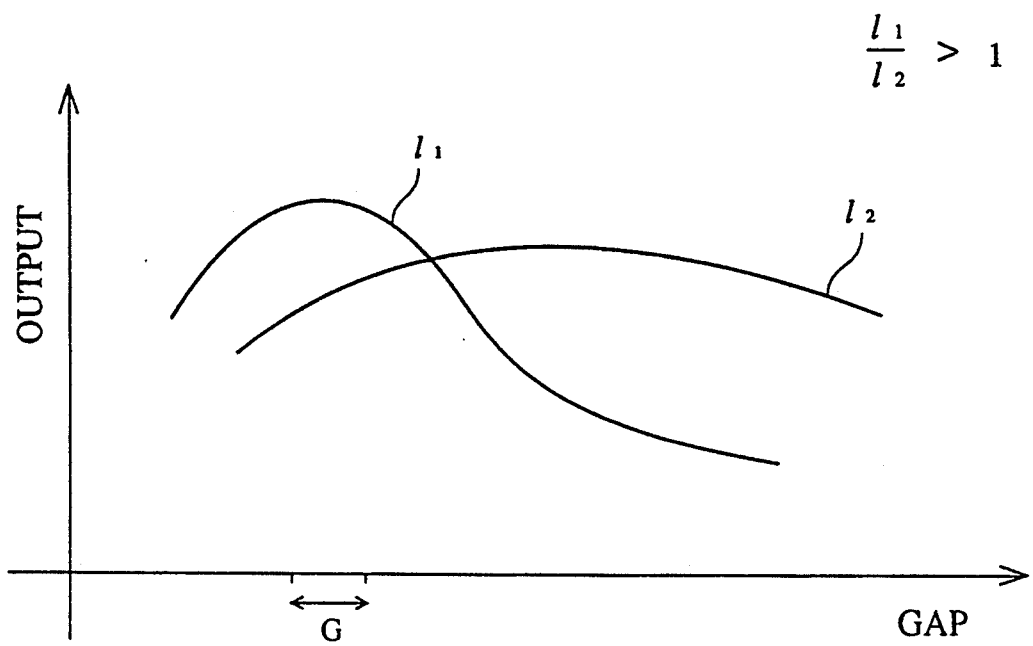
FIG. 8 is a graph showing the relations between a gap and an output in the magnetic encoder shown in FIG. 7.
Figure 9:
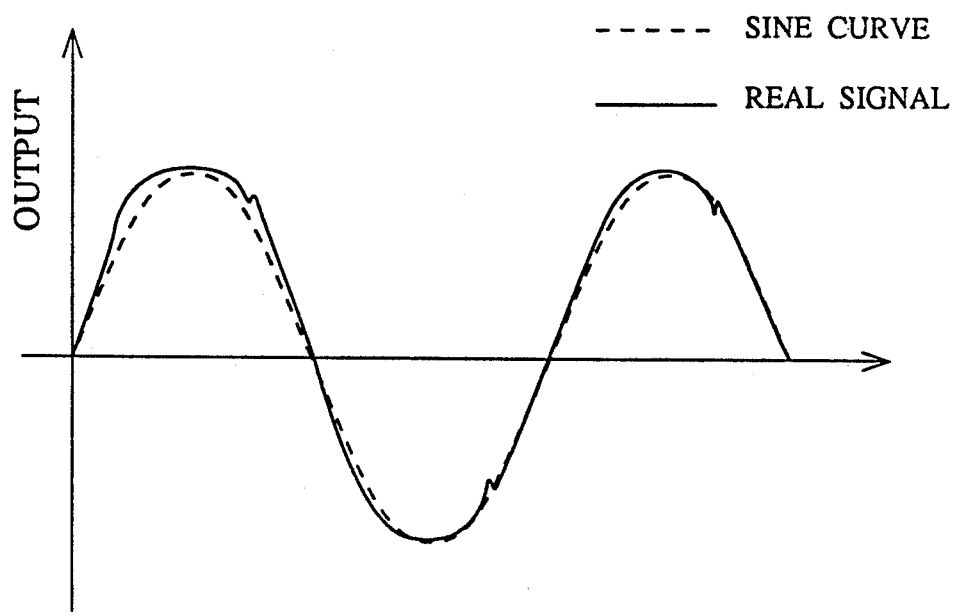
FIG. 9 is a graph showing a waveform of a detection signal of the magnetic encoder shown in FIG. 7.
Figure 10A:
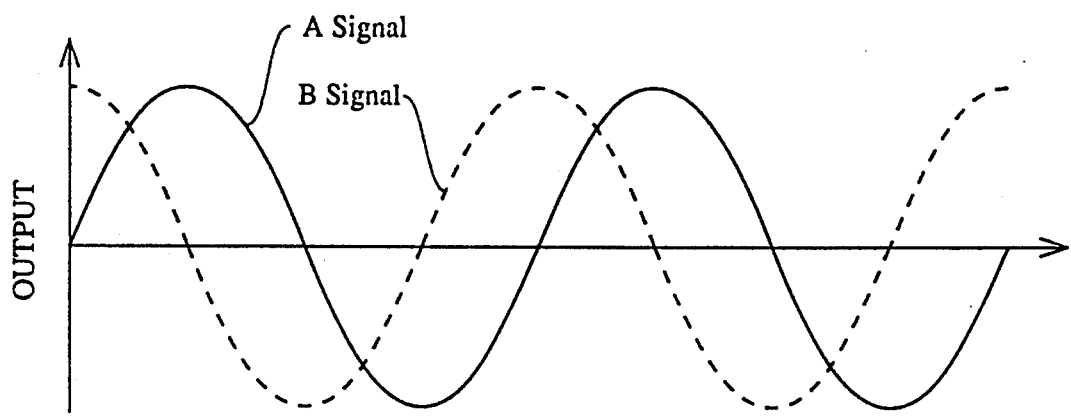
FIG. 10A is a view showing an A signal and a B signal having a phase difference of 90°.
Figure 10B:
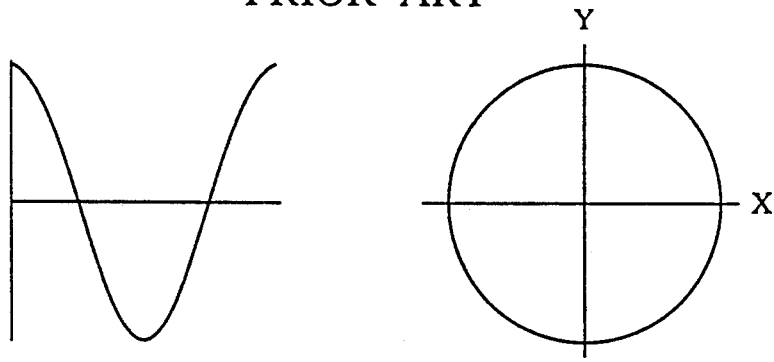
FIG. 10B is a view showing a Lissajous figure synthesized by combining the A signal as an X coordinate and the B signal as a Y coordinate.
Figure 10B:
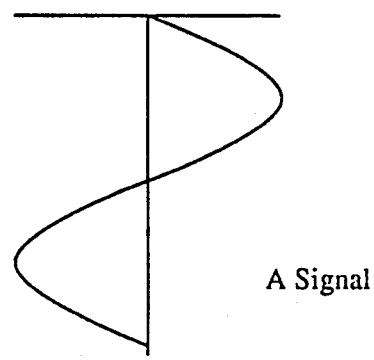

As is clear from FIGS. 5A–5C, the larger the number of thin, ferromagnetic layer patterns, the closer the Lissajous figure is to a circle. This means that the larger number of thin, ferromagnetic layer patterns can provide a higher resolution and thus a higher precision due to reduced Bark Hausen noises in the detection signal. Incidentally, although the width of the thin, ferromagnetic layer patterns should be as small as possible to suppress noises, it is generally 5–15 $\mu$m.

In the above example, the magnetic encoder has two increment phase elements, but it may be provided with three or more increment phase elements in the present invention.

Next, by changing the width of thin, ferromagnetic layer patterns constituting the magnetoresistance element disposed opposite to the increment phase element having a larger magnetic pole pitch, the effects of the pattern widths on the noise prevention were evaluated. In this experiment, two increment phase elements were used, and the magnetoresistance element opposite to the increment phase element having a larger magnetic pole pitch was constituted by three patterns with varied widths. Thus, the resulting magnetic encoders were provided with different ratios of a pattern width to a magnetic pole pitch. The test results are shown as Lissajous figures in FIGS. 12A–12C. Expressing the pattern width as W and the magnetic pole pitch as $\alpha$, a high resolution can be achieved with less noises when $W/\lambda \leq 1/50$.

In the above example, the magnetic encoder is provided with two increment phase elements. However, it should be noted that the magnetic encoder of the present invention may have three or more increment phase elements. In such a case, the requirement of the magnetic pole pitch should be met between one magnetic signal-generating means having a certain size of a magnetic pole pitch and another magnetic signal-generating means having a magnetic pole pitch which is smaller than the above magnetic pole pitch. For instance, in the case of three magnetic signal generating means having different magnetic pole pitches $P_1$, $P_2$, $P_3$ ($P_1 > P_2 > P_3$), the following two cases are permissible:

(i) $P_1/P_2 > 5$, $5 > P_2/P_3 > 1$ (for instance, $\simeq 1$), and
(ii) $P_1/P_2 > 5$, $P_2/P_3 > 5$.

Incidentally, in the above two cases, the following relations are preferably met:

(i) $W/P_1 \leq 1/50$, and
(ii) $W/P_1 \leq 1/50$, $W/P_2 \leq 1/50$,

In the magnetic encoder of the present invention, since the magnetoresistance element disposed opposite to the increment phase element having a larger magnetic pole pitch is constituted by five or more thin, ferromagnetic layer patterns, a high-precision signal with few noises can be obtained by utilizing the magnetic drum provided with a plurality of increment phase elements and a plurality of magnetoresistance elements opposite to the increment phase elements.

What is claimed is:

1. A magnetic encoder comprising:

a magnetic drum including on its side surface a plurality of magnetic signal-generating means having different magnetic pole pitches;

a plurality of magnetoresistance elements, each magnetoresistance element disposed opposite a respective magnetic signal-generating means and including a plurality of series-connected thin ferromagnetic layer patterns having a magnetoresistance effect so that an output signal from each magnetoresistance element is in the form of a substantially sinusoidal curve; and wherein the magnetic pole pitch of one magnetic signal-generating means is at least five times the magnetic pole pitch of other magnetic signal-generating means, and the magnetoresistance element opposite to the magnetic signal-generating means having a larger magnetic pole pitch includes at least five series-connected thin ferromagnetic layer patterns within the range of one-fourth the larger magnetic pole pitch.

2. The magnetic encoder, as recited in claim 1, wherein each thin ferromagnetic layer pattern has a length/width ratio of at least 50.

3. The magnetic encoder, as recited in claim 1, wherein the thin ferromagnetic layer pattern disposed opposite to the magnetic signal-generating means having a larger magnetic pole pitch has a width of 5–15 $\mu$m.

4. The magnetic encoder, as recited in claim 1, wherein the magnetic signal-generating means having a larger magnetic pole pitch has a magnetic pole pitch of at least 1000 $\mu$m.

5. The magnetic encoder, as recited in claim 1, wherein the thin ferromagnetic layer patterns disposed opposite to the magnetic signal-generating means having a larger magnetic pole pitch has a width of at most 1/50 of said larger magnetic pole pitch.

* * * * *

UNITED STATES PATENT AND TRADEMARK OFFICE
CERTIFICATE OF CORRECTION

PATENT NO. : 5,325,056

DATED : June 28, 1994

INVENTOR(S) : Yukimasa SHONOWAKI et al.

It is certified that error appears in the above-indentified patent and that said Letters Patent is hereby corrected as shown below:

TITLE PAGE in the Abstract [57], Line 16, after "includes" delete "by"

Column 1,  line 27, after "instance" insert --,--;

line 47, after "poles" insert --arranged--;

Column 2,  line 7, delete "a" (second occurence)

Column 4,  line 59, ",and" should be --.--;

Column 7,  line 5, "$a$" should be --$\lambda$--

Signed and Sealed this

Twenty-ninth Day of August, 1995

Attest:

BRUCE LEHMAN

*Attesting Officer*  *Commissioner of Patents and Trademarks*